United States Patent [19]
Isogai

[11] Patent Number: 6,111,281
[45] Date of Patent: Aug. 29, 2000

[54] SOLID-STATE IMAGE-PICKUP DEVICE AND MOS TRANSISTOR HAVING A REDUCED INCIDENTAL CAPACITANCE

[75] Inventor: Tadao Isogai, Yokohama, Japan

[73] Assignee: Nikon Corporation, Tokyo, Japan

[21] Appl. No.: 08/812,482

[22] Filed: Mar. 6, 1997

[30] Foreign Application Priority Data

Mar. 22, 1996 [JP] Japan .................................... 8-065906

[51] Int. Cl.[7] .......................... H01L 31/113; H01L 29/78
[52] U.S. Cl. ............................ 257/292; 257/386; 257/403
[58] Field of Search ................................. 257/292, 386, 257/403

[56] References Cited

U.S. PATENT DOCUMENTS

| | | | |
|---|---|---|---|
| 3,814,992 | 6/1974 | Kump et al. | 257/403 |
| 4,268,845 | 5/1981 | Koike et al. | 257/292 |
| 4,584,608 | 4/1986 | Soneda et al. | 257/292 |
| 4,841,346 | 6/1989 | Noguichi | 257/403 |
| 4,990,974 | 2/1991 | Vinal | 257/403 |
| 5,369,295 | 11/1994 | Vinal | 257/403 |

*Primary Examiner*—Gene M. Munson
*Attorney, Agent, or Firm*—Klarquist Sparkman Campbell Leigh & Whinston, LLP

[57] ABSTRACT

The invention is directed to reducing incidental capacitance associated with a MOS transistor, especially such a transistor as used with a solid-state image-pickup device, without reducing the channel conductance of the MOS transistor. To such end, $N^+$-type high-concentration fields are formed near the surface of a P-type well field that in a semiconductor substrate. An N-type low-concentration field is formed between and surrounding the $N^+$-type high-concentration fields. A depletion layer is formed by making PN junctions between $N^+$-type high-concentration fields and the well field in a reverse-bias state to deplete the perimeter of the $N^+$-type high-concentration fields and the entire N-type low-concentration field.

12 Claims, 4 Drawing Sheets

$V_W < V_S, V_D$ $V_W < V_S, V_D$

SOLID-STATE IMAGE-PICKUP DEVICE AND MOS TRANSISTOR HAVING A REDUCED INCIDENTAL CAPACITANCE

FIELD OF THE INVENTION

This invention pertains to solid-state image-pickup devices and to MOS transistors used in such devices.

BACKGROUND OF THE INVENTION

MOS transistors have conventionally been used as switching elements in semiconductor integrated circuits, including but certainly not limited to, solid-state image-pickup devices (SSIPDs) as line and image sensors.

FIG. 6 is a schematic diagram showing a representative example of an SSIPD 1 employing MOS transistors as switching elements. The SSIPD comprises an image-pickup field 2 in which multiple pixels (not shown in drawing) are arrayed as a matrix. Each pixel can receive and accumulate light from a photographic object and convert the accumulated light into corresponding signal charges.

Each pixel is usually connected to a horizontal selection line (i.e., a line extending parallel to the output signal line 6 shown and discussed below) and to a respective vertical signal line 4. Each vertical signal line 4 is connected to a source/drain terminal of a respective horizontal-relay MOS transistor 3; the other source/drain terminal of the horizontal-relay MOS transistor is connected to an appropriate output signal line 6. The gate of the horizontal-relay MOS transistor 3 is connected to a horizontal-scanning circuit 5.

The horizontal scanning circuit 5 applies a voltage pulse on the gates of the horizontal-relay MOS transistors 3 to effect ON and OFF control of the horizontal-relay MOS transistors 3. An output terminal 7 associated with each output signal line 6 outputs signal charges to downstream circuitry.

Although six horizontal-relay MOS transistors 3 and six vertical signal lines 4 are shown in FIG. 6, it will be understood that there are a large number of horizontal-relay MOS transistors 3 and vertical signal lines 4 (the number corresponding to the number of pixels aligned in the horizontal direction in the image-pickup field 2, for example, 800).

With respect to each pixel in the image-pickup field 2, a signal corresponding to a signal charge (the signal charge corresponding to an amount of light accumulated by the respective pixel from the photographic object) is relayed via the vertical signal line 4 connected to that pixel to one source/drain terminal of the respective horizontal-relay MOS transistor 3 at a desired pulse timing. When the gate of the horizontal-relay MOS transistor 3 receives a voltage pulse of a desired level from the horizontal scanning circuit 5, the signal at one source/drain terminal of the horizontal relay MOS transistor 3 is transferred to the other source/drain terminal and thus to the output signal line 6. The output signal line 6 outputs the signal from the output terminal 7 to downstream circuitry.

As summarized above, the SSIPD 1 utilizes MOS transistors (horizontal-relay MOS transistors 3) as switching elements. Various performance criteria, such as operating speed, breakdown resistance, etc., are required in MOS transistors. One problem that can affect performance of a MOS transistor is its incidental capacitance. The incidental capacitance of switching elements used in SSIPDs, such as line and image sensors, etc., can seriously affect the entire device, and is considered a critical problem.

For example, in the SSIPD 1 shown in FIG. 6, an incidental capacitance $C_s$ exists on the output signal line 6 side of each horizontal-relay MOS transistor 3. If the number of horizontal-relay MOS transistors 3 aligned in the horizontal direction is $N_H$, then the overall capacitance $C_H$ of the output signal lines 6 is expressed by Equation (1), below.

$$C_H = (N_H \cdot C_s) + \text{(Intrinsic capacitance of output signal line 6)} \quad (1)$$

This overall capacitance $C_H$ is "parasitic" in that it serves to lessen the output signal relative to "noise."

In recent years, the number of pixels in SSIPDS, such as line and image sensors, etc., has tended to increase. This increase in the number of pixels aligned in the horizontal direction increases the number $N_H$ of horizontal-relay transistors 3. Consequently, when the number of pixels increases, the overall capacitance $C_H$ of the output signal lines 6 increases, creating the problem of reducing the sensitivity and operating speed of the SSIPD.

FIG. 7 is a cross-section of a representative prior-art normally OFF (enhancement) MOS transistor 10B usable as a switching element (e.g. as the horizontal-relay MOS transistor 3 in FIG. 6). In this MOS transistor 10B, a P-type well field 12 is situated in the main surface of an N-type substrate 11 (e.g., silicon substrate). A P$^+$-type contact field 12A, which forms a contact to the P-type well field 12, is situated near the surface of the P-type well field 12. N-type high-concentration fields (termed herein N$^+$-type high-concentration fields) 13, 14 are formed near the surface of the well field 12, separated by a desired distance.

One of the N$^+$-type high-concentration fields 13, 14 serves as a source field and the other serves as a drain field. But, since the polarity of the N$^+$-type high-concentration fields 13, 14 is sometimes reversed when the MOS transistor is used as a switching element, it is not necessarily accurate to always call one or the other of them a source field. However, for the sake of convenience, in order to distinguish the two in the following description, the N$^+$-type high-concentration field 13 is referred to as the source field and the N$^+$-type high-concentration field 14 is referred to as the drain field.

An insulating (oxide) film 17 comprising, e.g., SiO$_2$ is formed on the surface of the N-type substrate 11 (including the well field 12), and a gate electrode 15 is formed in the insulating film 17 at a location corresponding to the space between the N$^+$-type high-concentration fields 13, 14.

When the MOS transistor 10B is used as a switching element, the respective incidental capacitance $C_s$ presents a significant problem that can lead to reduction in sensitivity and operating speed, as noted above, when this MOS transistor 10B is utilized in a SSIPD.

The incidental capacitance of the MOS transistor 10B is determined by the PN-junction capacitance $C_j$ of the PN junction formed between the source field 13, the drain field 14, and the P-type well field 12.

When the concentration distribution at the junction of the PN junction is approximated by a one-sided step junction, the junction capacitance $C_j$ of the PN junction is expressed by Equations (2) and (3), below.

$$C_j = \epsilon_s / X_d \quad (2)$$

$$X_d = [2\epsilon_s (V_R + \phi_T)/qC_W]^{1/2} \quad (3)$$

The $\epsilon_s$ term in Equations (2) and (3) is the dielectric constant of the semiconductor, $X_d$ is the depletion-layer width, $V_R$ is the reverse-bias voltage applied to the PN junction, $\phi_T$ is the built-in voltage of the PN junction, q is the electronic charge, and $C_W$ is the impurity concentration of the well field 12.

In addition, when silicon is used as the semiconductor substrate material, the dielectric constant $\epsilon_s$ is $11.7\epsilon_0$ wherein $\epsilon_0$ is the dielectric constant in a vacuum. Although $\phi_T$ varies depending on the concentration, it is approximately 1 V at most.

As is clear from Equations (2) and (3), reducing the impurity concentration $C_W$ of the well field 12 or applying a reverse-bias voltage $V_R$, both increasing the depletion-layer width $X_d$, is effective in reducing the junction capacitance $C_j$ of the PN junction part.

Given such limitations as the punch-through breakdown resistance of the element, however, it is usually necessary to limit the impurity concentration $C_W$ of the well field 12 to within a specific range, which can make it difficult to reduce $C_j$ drastically. For example, in order to decrease the junction capacitance $C_j$ of the PN junction by half, it is necessary, according to Equations (2) and (3), to reduce the impurity concentration $C_W$ of the well field 12 to one-fourth. This is not practical because of the above-mentioned breakdown limitation.

On the other hand, with respect to the MOS transistor 10B of the prior-art device shown in FIG. 7, it is possible to reduce the PN junction capacitance $C_j$ by widening the depletion layer surrounding the drain and source fields. This is done by applying a reverse-bias voltage $V_R$ at the PN junctions between the P-type well field 12 and each of the source field 13 and the drain field 14. The result is shown in FIG. 8.

In FIG. 8, $V_W$, $V_S$, $V_D$, and $V_G$ indicate the potential (applied voltage) of the well field 12, source field 13, drain field 14, and gate electrode 15, respectively. These potentials $V_W$, $V_S$, $V_D$, $V_G$ change according to the operational status of the device. As explained above, since the polarities of the source and drain fields are sometimes reversed, the source and drain fields cannot be uniformly specified.

By way of example in this discussion, the potential $V_G$ of the gate electrode 15 is 5 V at its logic "high" (when ON) and 0 V at its logic "low" (when OFF). The potential $V_S$ of the source field 13 is always 0 V. The potential $V_D$ of the drain field 14 is the same as or greater than the potential $V_S$. The potential $V_W$ of the well field 12 is −5 V, which is lower than the potential $V_S$ because of the reverse-bias state of the PN junction between the well field 12 and the source field 13 and drain field 14. Namely, the reverse-bias voltage $V_R$ applied at the PN junctions between the P-type well field 12 and the source field 13 and the drain field 14 is 5 V. (Hereinafter, this reverse-bias voltage is referred to simply as being applied at the PN junctions.) Under such conditions, a depletion layer 20B is formed surrounding the source field 13 and drain field 14 of the MOS transistor 10B (i.e., the width of the depletion layer increases).

Another consequence of the foregoing example is that, from Equations (2) and (3), if $\phi_T$ is 1 V, then the junction capacitance $C_j$ of the PN junction of this MOS transistor 10B is $(1/6)^{1/2}$ (i.e., 0.4082) times the junction capacitance when the reverse-bias voltage $V_R$ is not applied, thereby more than halving the PN junction capacitance $C_j$.

Whenever the MOS transistor 10B of FIG. 8 is used as the horizontal-relay MOS transistor 3 in the SSIPD 1 of FIG. 6, the capacitances $C_S$ and $C_H$ can be reduced by placing the PN junctions between the well field 12 and each of the source field 13 and drain field 14 in a reverse-bias state.

Unfortunately, however, whenever a reverse-bias voltage is applied at the PN junction between the source/drain field 13 and the well field 12 in the enhancement-type (normally OFF) MOS transistor 10B, the switching-element conductance (channel conductance) is reduced. This creates a problem of reducing the operating speed of the SSIPD.

The channel conductance $g_D$ of the MOS transistor 10B is expressed by Equation (4), below:

$$g_D = (\Delta I_D/\Delta V_{DS}) = (W/L)\mu C_{OX}(V_{GS}-V_T) \tag{4}$$

wherein W denotes the channel width and L denotes the channel length (i.e., distance between the source field 13 and the drain field 14). The amount of shift $\Delta V_T$ in the threshold voltage $V_T$ (voltage to switch from ON to OFF or OFF to ON) when a reverse-bias voltage is applied at the PN junction of the MOS transistor 10B (PN junction between the source field 13 and the well field 12) is expressed by Equation (5):

$$\Delta V_T = [2q\epsilon_s C_W(V_R+\phi_T)]^{1/2}/C_{OX} - (2q\epsilon_s C_W \phi_T)^{1/2}/C_{OX} \tag{5}$$

wherein $C_{OX}$ is the gate oxide film capacitance (which is, e.g., $6.9\times10^{-8}$ F/cm$^{-2}$ when (or if) the thickness of the insulating film (oxide film) 17 is 500 Ångstroms).

Changes in the channel conductance $g_D$ occur, when a reverse-bias voltage $V_R$ (e.g., 5 V) is impressed at the PN junction, as follows, applying Equations (4) and (5). First, the amount of shift $\Delta V_T$ in the threshold voltage is found according to Equation (5); $\Delta V_T$ is 2.7 V when $C_W$ is $5\times10^{16}$ cm$^{-3}$, $V_R$ is 5 V, $\phi_T$ is 1 V, and $\epsilon_s$ is $11.7\epsilon_0$. Consequently, when the threshold voltage before applying the reverse-bias voltage $V_R$ (5 V) is 1 V, the threshold voltage after applying the reverse-bias voltage $V_R$ is 3.7 V (i.e., 1 V+2.7 V).

As is evident from Equation (4), the channel conductance $g_D$ is proportional to ($V_{GS}-V_T$). As explained above, since the potential of the gate electrode 15 when ON is assumed to be 5 V, and the potential $V_S$ of the source field 13 is assumed to be always at 0 V during ON operation, $V_{GS}$ is at 5 V during ON operation. Consequently, as shown above, ($V_{GS}-V_T$) changes from 4 V to 1.3 V as the threshold voltage is changed from 1 V to 3.7 V. In other words, the channel conductance $g_D$, which is proportional to ($V_{GS}-V_T$), decreases to approximately ⅓ due to the shift in the threshold voltage $V_T$.

The reduction in the channel conductance $g_D$ can be suppressed by increasing $V_{GS}$. But, in order to increase $V_{GS}$, it is necessary to increase the pulse amplitude applied to the gate field 15 (e.g., applying pulse voltages of 0 V (during OFF operation) and 8 V (during ON operation)), or to shift the low-level and high-level values of pulses overall (e.g., applying a pulse voltage of 2.7 V (during OFF operation) and 7.7 V (during ON operation)) depending on the threshold-voltage shift $\Delta V_T$. This is impractical because power consumption is increased or the drive circuit is made more complex.

SUMMARY OF THE INVENTION

This invention addresses such circumstances, and has as its purpose the reduction of incidental capacitance of the MOS transistor, without reducing its conductance.

According to one aspect of the present invention, solid-state image-pickup devices are provided that comprise a pixel operable to photoelectrically convert incident light to an electrical signal; an output line for outputting the electrical signal produced by the pixel; a MOS transistor; and a scanning-signal source (e.g., a processor or horizontal scanning circuit). The MOS transistor constitutes a representative "relay" and comprises a gate, a first source/drain, and a second source/drain. The scanning-signal source is connected to the gate, and is operable to produce a signal sufficient to cause the gate to either pass or not pass the electrical signal from the first source/drain to the second source/drain.

More specifically, the MOS transistor comprises a semiconductor substrate in which is formed a low-concentration well field of a primary conductor. A high-concentration contact field of the primary conductor contacts the well field. Formed in the well field near the surface but separate from the contact field is a primary high-concentration source field of a secondary conductor. Also formed in the well field near the surface but separate from the contact field and the source field is a secondary high-concentration drain field of the secondary conductor. The MOS transistor also comprises a low-concentration field of the secondary conductor formed between the source field and the drain field and surrounding the source and drain fields near the surface of the well field. A gate field is formed above and separate from the low-concentration field of the secondary conductor so as to define a junction of the primary conductor with the secondary conductor between the source field and the drain field. The well field is operable in a reverse-bias state in which the perimeters of the source and drain fields and the low-concentration field of the secondary conductor are depleted. Preferably, the substrate and well field are N-type and P-type, respectively. With such a configuration, the high-concentration contact field of the primary conductor is $P^+$-type and the source and drain fields are $N^+$-type.

Preferably, the source field is connected to the output line and the drain field is connected to the pixel.

Typically, the solid-state image-pickup devices summarized above include multiple pixels and multiple MOS transistors for controlling readout of electrical signals from the pixels. The multiple pixels are preferably arranged in a matrix having length and width. The scanning-signal source is connected to the gates of all the MOS transistors to controllably turn "ON" the MOS transistors in a coordinated fashion.

According to another aspect of the present invention, solid-state image-pickup devices are provided that comprise a pixel operable to photoelectrically convert incident light to a signal charge; an output line for outputting signal charges produced by the pixel; an electrical relay connected between the pixel and the output line so as to relay the signal charges from the pixel to the output line; and a controller connected to the electrical relay. The controller is operable to send a signal to the electrical relay urging the electrical relay to turn ON to conduct the signal charges from the pixel to the output line.

In such devices, the electrical relay comprises a MOS transistor, comprising a semiconductor substrate; a low-concentration well field of a primary conductor formed in the semiconductor substrate; a high-concentration contact field of the primary conductor contacting the well field; a primary high-concentration source field of a secondary conductor formed in the well field near the surface of the well field but separate from the contact field; a secondary high-concentration drain field of the secondary conductor separate from the contact field and surrounding the source field in the well field near the surface of the well field; a low-concentration field of the secondary conductor formed between the source field and the drain field and surrounding the source and drain fields near the surface of the well field; and a gate field. The low-concentration field of the secondary conductor is preferably in a ring shape. The gate field is also preferably formed in a ring shape above and separate from the low-concentration field of the secondary conductor so as to define a junction of the primary conductor with the secondary conductor between the source field and the drain field, the well field being operable in a reverse-bias state such that the perimeters of the source and drain fields and the low-concentration field of the secondary conductor are depleted.

Preferably, in devices having the foregoing configuration, the primary high-concentration field of the secondary conductor is connected to the output line and the secondary high-concentration field of the secondary conductor is connected to the pixel.

According to another aspect of the invention, MOS transistors are provided that comprise a low-concentration well field of a primary conductor formed in a semiconductor substrate; a high-concentration contact field of the primary conductor contacting the well field; a primary high-concentration source field of a secondary conductor formed in the well field near the surface of the well field but separate from the contact field; a secondary high-concentration drain field of the secondary conductor formed in the well field near the surface of the well field but separate from the contact field and the source field; a low-concentration field of the secondary conductor formed between the source field and the drain field and surrounding the source and drain fields near the surface of the well field; and a gate field. The gate field is formed above and separate from the low-concentration field of the secondary conductor so as to define a junction of the primary conductor with the secondary conductor between the source field and the drain field, the well field being operable in a reverse-bias state such that the perimeters of the source and drain fields and the low-concentration field of the secondary conductor are depleted.

Preferably, in MOS transistors as summarized above, the substrate is N-type and the well field is P-type. Also, the high-concentration contact field of the primary conductor is preferably $P^+$-type, and the source and drain fields are preferably $N^+$-type.

According to yet another aspect of the invention, methods are provided for reducing incidental capacitance exhibited by a MOS transistor. Such transistors, as summarized above, include a semiconductor substrate, a low-concentration well field of a primary conductor formed in the substrate, a high-concentration contact field of the primary conductor contacting the well field, a primary high-concentration source field of a secondary conductor formed in the well field near the surface of the well field but separate from the contact field, a secondary high-concentration drain field of the secondary conductor formed in the well field near the surface of the well field but separate from the contact field and the source field, and a gate field. According to the method, a low-concentration field of the secondary conductor is provided between the source field and the drain field and surrounding the source and drain fields near the surface of the well field. The gate field is situated above and separate from the low-concentration field of the secondary conductor so as to define a junction of the primary conductor with the secondary conductor between the source field and the drain field. The well field operates in a reverse-bias state such that the perimeters of the source and drain fields and the low-concentration field of the secondary conductor are depleted.

The foregoing and additional features and advantages of the present invention will be more readily apparent from the following detailed description, which proceeds with reference to the accompanying drawings.

DETAILED DESCRIPTION

Example embodiments of this invention will be explained below, referring to the figures. Certain components that are the same as described above with respect to the prior art have the same reference designators and are not described further herein.

Figure 1:
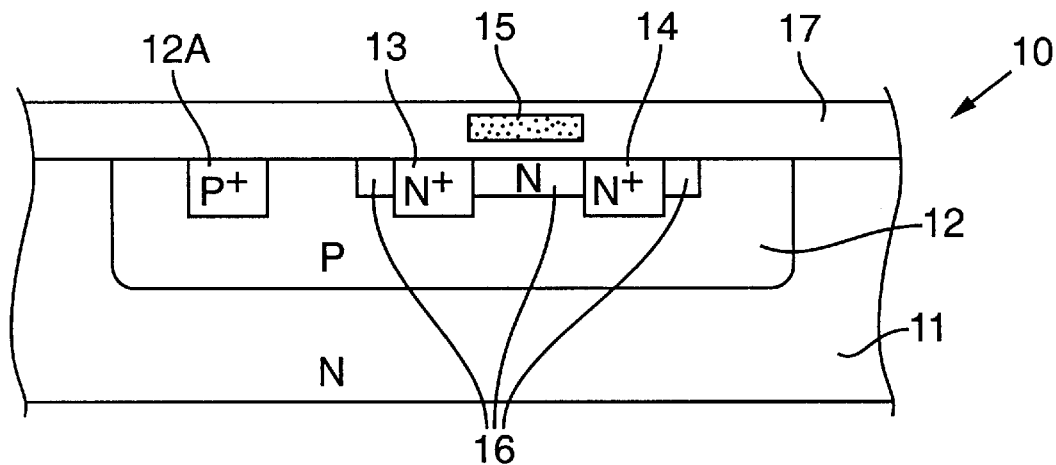
FIG. 1 is a sectional view of a first example embodiment of a MOS transistor according to the invention.
Figure 7:
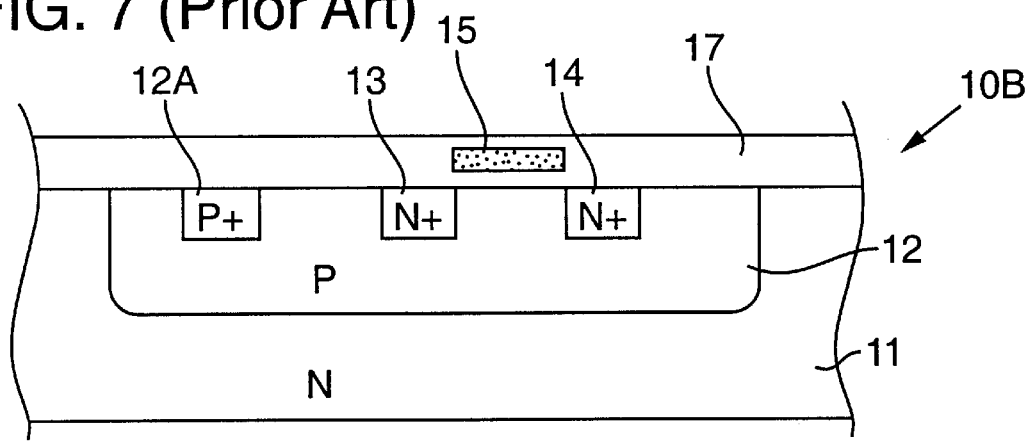
FIG. 7 is a sectional view of a prior-art MOS transistor of a type used in the solid-state image-pickup device of FIG. 6.
Figure 8:
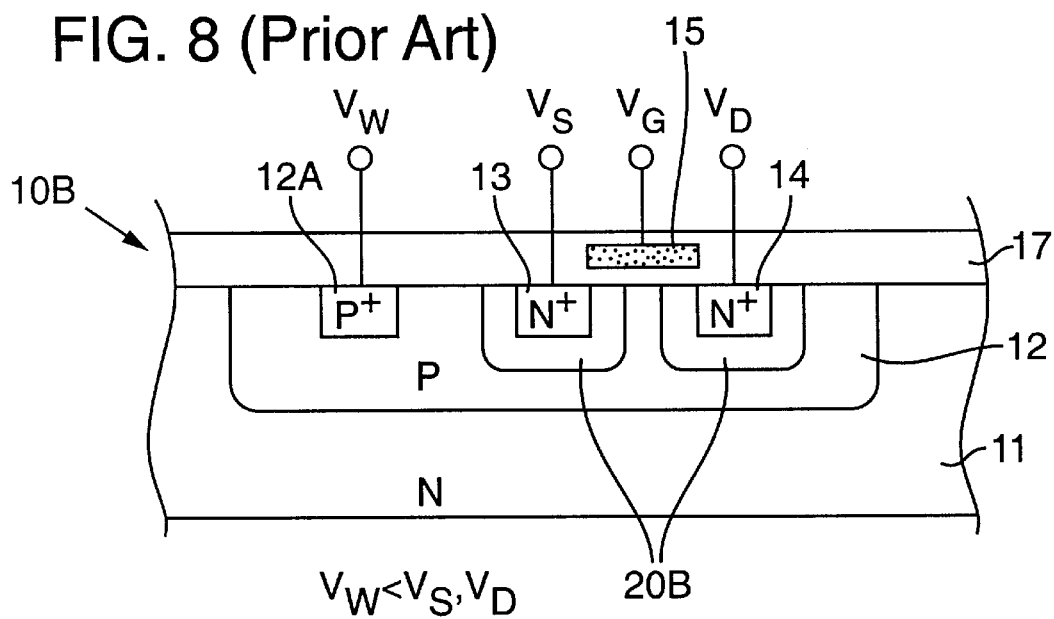
FIG. 8 is a sectional view of the prior-art MOS transistor of FIG. 7 showing a condition in which the PN junction between the well field and the source and drain fields is in a reverse-bias state.

FIG. 1 is a sectional view of an example embodiment of a MOS transistor 10 according to this invention. The MOS transistor 10 has certain features in common with the prior-art MOS transistor shown in FIG. 7, but the FIG. 1 embodiment has an N-type low-concentration field 16 (i.e., a low-concentration field of the secondary conductor). The low-concentration field 16 has a lower dopant concentration than the N$^+$-type high-concentration fields 13 and 14. The low-concentration field 16 is situated between and surrounds each of the N$^+$-type high-concentration field 13 (i.e., the primary high-concentration field of the secondary conductor) and the N$^+$-type high-concentration field 14 (i.e., the secondary high-concentration field of the secondary conductor). The dopant concentration of the N-type low-concentration field 16 is set such that the N-type low-concentration field 16 is depleted when a reverse-bias voltage is applied, as discussed below.

Further with respect to the FIG. 1 embodiment, one of the N$^+$-type high-concentration fields 13 and 14 is the source field and the other is the drain field. But, for the sake of convenience and to distinguish them in this discussion, the N$^+$-type high-concentration field 13 is termed the "source field" and the N$^+$-type high-concentration field 14 is termed the "drain field."

Figure 2:
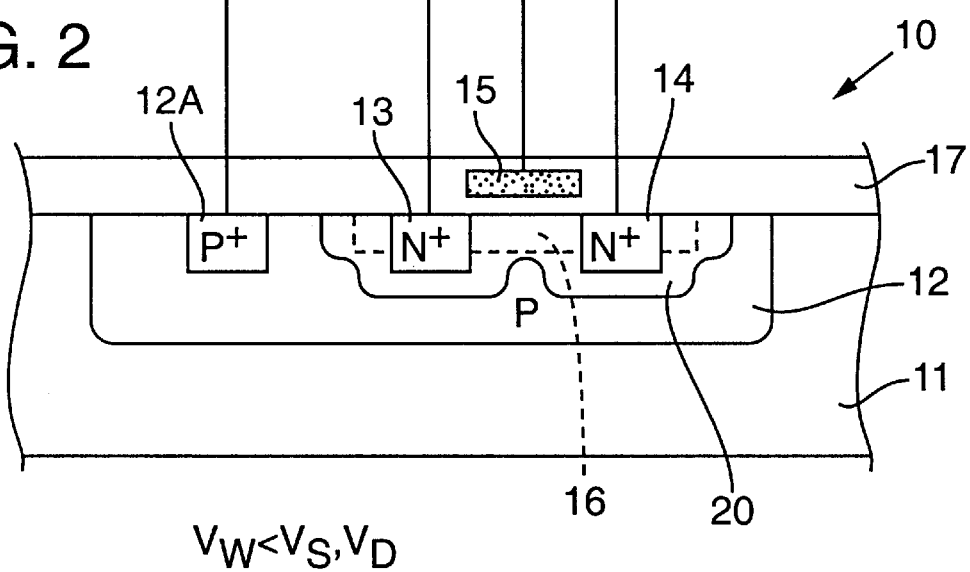
FIG. 2 is a sectional view of the FIG. 1 embodiment showing a condition in which the PN junction between the well field and source and drain fields is in a reverse-bias state.

FIG. 2 is a sectional view showing the condition when the PN junction between a low-concentration well field 12 ("well field") and the source field 13 and drain field 14 of the MOS transistor 10 is reverse-biased. In FIG. 2, $V_W$, $V_S$, $V_D$, and $V_G$ denote the potentials of the well field 12, source field 13, drain field 14, and gate electrode 15, respectively. These potentials $V_W$, $V_S$, $V_D$, $V_G$ change according to the operational status of the MOS transistor. As explained above, since the polarities of the source and drain fields can be reversed, the polarities cannot be uniformly specified. However, for the sake of simplicity, each potential $V_W$, $V_S$, $V_D$, $V_G$ can be represented as follows:

The potential $V_G$ of the gate electrode 15 is 5 V at its logic "high" level (i.e., when turned ON) and 0 V at its logic "low" level (i.e., when turned OFF). The potential $V_S$ of the source field 13 is constantly at 0 V. The potential $V_D$ of the drain field 14 is the same as, or greater than, the potential $V_S$ of the source field 13. The potential $V_W$ of the well field 12 (i.e., the voltage applied to a high-concentration contact field 12A ("contact field")) is –5 V, which is lower than the potential $V_S$ of the source field 13 because of the reverse-bias state of the PN junction between the well field 12 and the source field 13 and drain field 14. The reverse-bias voltage $V_R$ applied at the PN junction between the P-type well field 12 and the source field 13 and the drain field 14 is 5 V.

Under the foregoing conditions, a depletion layer 20 is formed in the entire N-type low-concentration field 16 and surrounding the N$^+$-type high-concentration fields 13 and 14 and the N-type low-concentration field 16.

As a result of the above, from Equations (2) and (3), the junction capacitance $C_j$ of the PN junction in the MOS transistor 10 is $(\frac{1}{6})^{1/2}$ (i.e., 0.4082) times the junction capacitance when a reverse-bias voltage $V_R$ is not applied. This enables the PN junction capacitance $C_j$ to be at least halved.

Furthermore, since the entire low-concentration field 16 surrounding the source field 13 and drain field 14 is depleted by applying the reverse-bias voltage $V_R$ in this example embodiment, the junction capacitance $C_j$ of the PN junction in this MOS transistor 10 can be reduced even more. The reasons for this are explained below.

Generally, the P-type well field 12 is formed by implanting P-type dopants into the surface of the N-type substrate 11 and dispersing those P-type dopants inside the N-type substrate 11 by thermal diffusion. The well-field 12 concentration $C_W$ formed by the thermal diffusion is not uniform on the interior and the concentration is at its highest near the surface (i.e., at the sides of the source field 13 and drain field 14). In addition, as is clear from Equations (2) and (3), the spread of the depletion layer 20 is restricted in the areas in which the concentration $C_W$ of the well field 12 is high. Furthermore, the junction capacitance $C_j$ is greatest in areas where $C_W$ is high (i.e., the sides of the source field 13 and drain field 14). As is clear from Equations (2) and (3), this is because the spread of the depletion layer 20 is suppressed when the concentration $C_W$ of the well field 12 is high.

In this example embodiment, the N-type low-concentration field 16 is formed in areas in which the concentration $C_W$ of the well field 12 is high (namely, between and surrounding the source field 13 and drain field 14). The N-type low-concentration field 16 is depleted by applying a reverse-bias voltage $V_R$ at the PN junction. Consequently, since spreading of the depletion layer increases in the horizontal direction, the capacitance of the sides of the source field 13 and drain field 14 decreases.

Whereas the MOS transistor 10 in this example embodiment is a normally ON-type transistor, OFF characteristics when $V_G$ is 0 V can be obtained by applying the reverse-bias voltage $V_R$ at the PN junction. Consequently, a high channel conductance can be maintained. The reasons for this are explained below.

The channel conductance $g_D$ of the MOS transistor 10 is proportional to $(V_{GS} - V_T)$, as is clear from Equation (4). To increase the value of $g_D$ at the same $V_{GS}$, the threshold voltage $V_T$ must be kept small. It is possible to do this by making the threshold voltage $V_T$ negative. However, since the voltage $V_G$ applied to the gate electrode 15 in this example is 0 V (during OFF operation) and 5 V (during ON operation), if the threshold voltage $V_T$ is negative, the MOS transistor 10 ceases to function as a switching device because it does not turn OFF when the low-level voltage (0 V) is applied to the gate electrode 15. Consequently, the threshold voltage $V_T$ cannot be negative. Therefore, the threshold voltage $V_T$ must be a small positive value.

It is assumed, for example, that the amount of shift $\Delta V_T$ in the threshold voltage $V_T$ (when the reverse-bias voltage $V_R$=5 V is applied to the PN junction) is 2.7 V, the same value assumed for the prior-art normally OFF-type MOS transistor. If the threshold voltage $V_T$ before applying the reverse-bias voltage $V_R$ is set to −1.7 V (since the MOS transistor is a normally ON-type), then the threshold voltage $V_T$ can be 1 V ($V_T$=−1.7 V+2.7 V) by applying the reverse-bias voltage $V_R$. Therefore, smaller threshold voltage $V_T$ (1 V), compared with the prior-art normally OFF-type MOS transistor (3.7 V), and also OFF characteristics ($V_T$ is positive) can be achieved when reverse-bias voltage is applied. Consequently, in terms of maintaining a small threshold voltage $V_T$, according to Equation (4), this MOS transistor 10 can attain a high channel conductance $g_D$.

Figure 3:
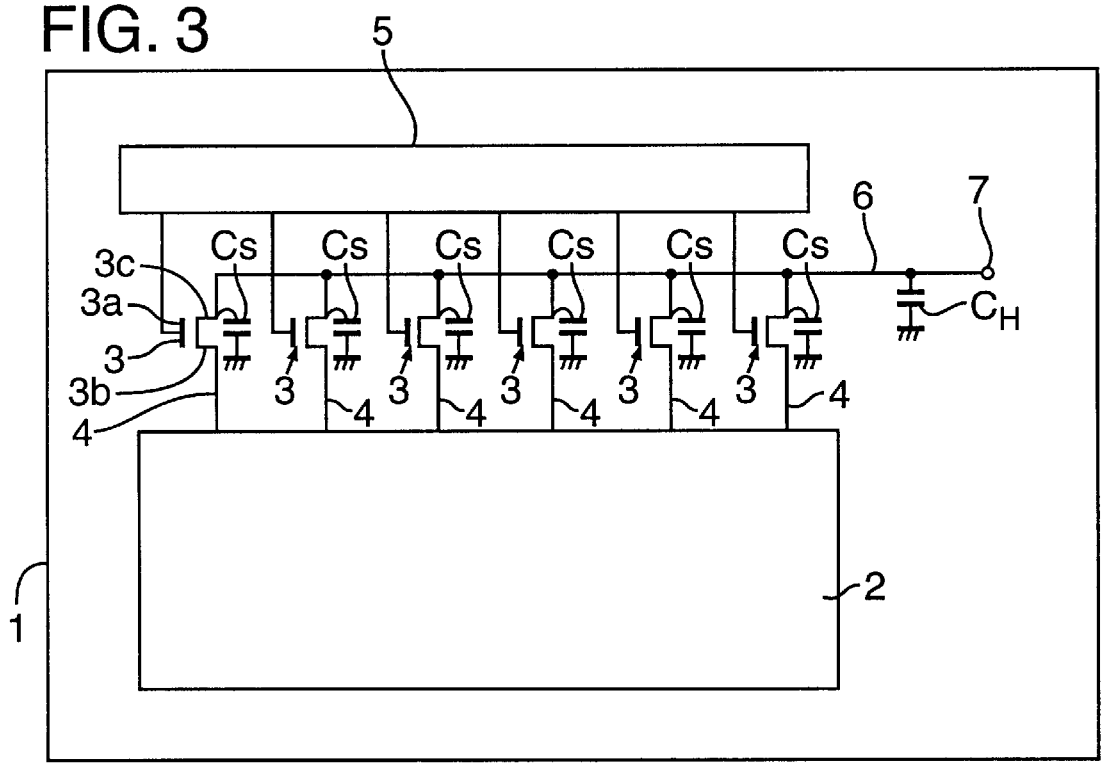
FIG. 3 is a schematic block diagram of an example embodiment of a solid-state image-pickup device according to the invention.
Figure 6:
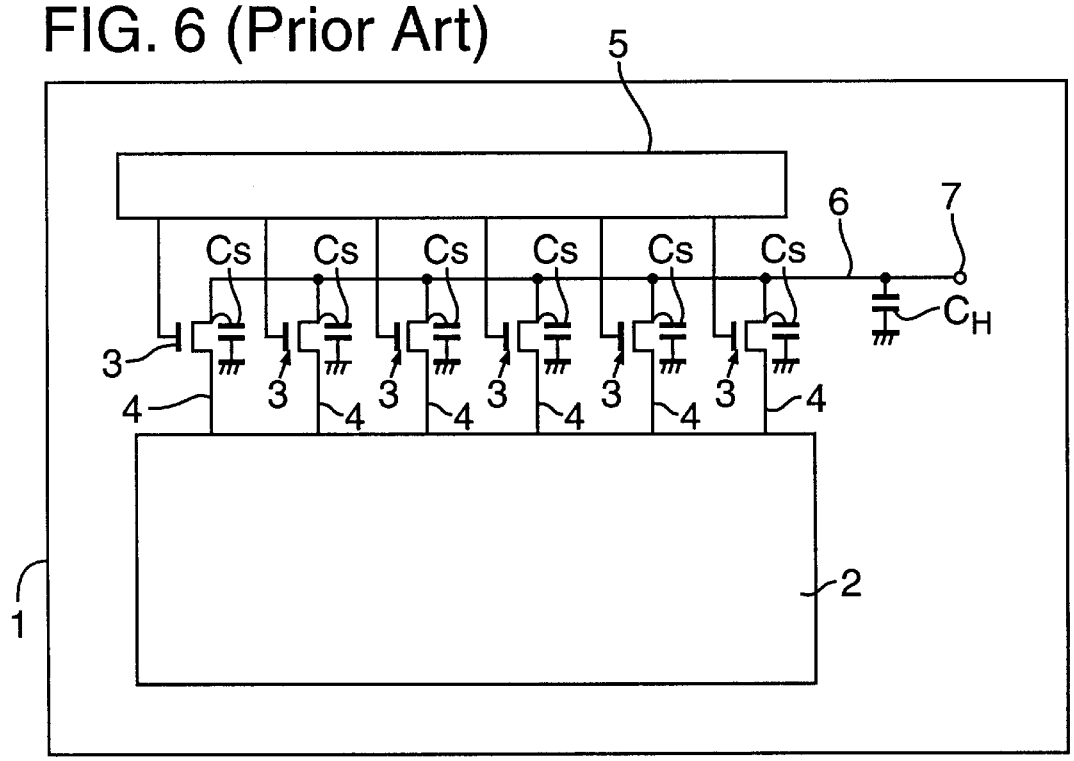
FIG. 6 is a schematic block diagram of a prior-art solid-state image-pickup device.

The MOS transistor 10 described above can be used as a switching device 3 in a SSIPD 1 as shown in FIG. 3. The SSIPD 1 of FIG. 3 shares certain features with the SSIPD shown in FIG. 6. In the FIG. 3 embodiment, the MOS transistor 10 shown in FIG. 2 is utilized as the horizontal-relay MOS transistor 3 that serves as a switching element (as a representative "switching means") for relaying signals output from the image-pickup pixel array 2 (as a representative "photoelectric conversion means") to the output signal lines 6 (as representative "output means") as controlled by a horizontal scanning circuit 5 (as a representative "control means") or analogous circuit such as a processor or the like that is operable to generate readout pulses in a controlled way.

In FIG. 3, each MOS transistor 3 is connected as follows: the gate 3a is connected to the horizontal scanning circuit 5, a first source/drain 3b is connected to the pixel array 2, and a second source/drain 3c is connected to the output line 6.

In the MOS transistor used in this example embodiment, the incidental capacitance is reduced without reducing the channel conductance. Consequently, any incidental capacitance $C_h$ arising in the output signal line 6 can be further reduced to approximately one-third the incidental capacitance in the prior-art SSIPD shown in FIG. 6.

Figure 4:
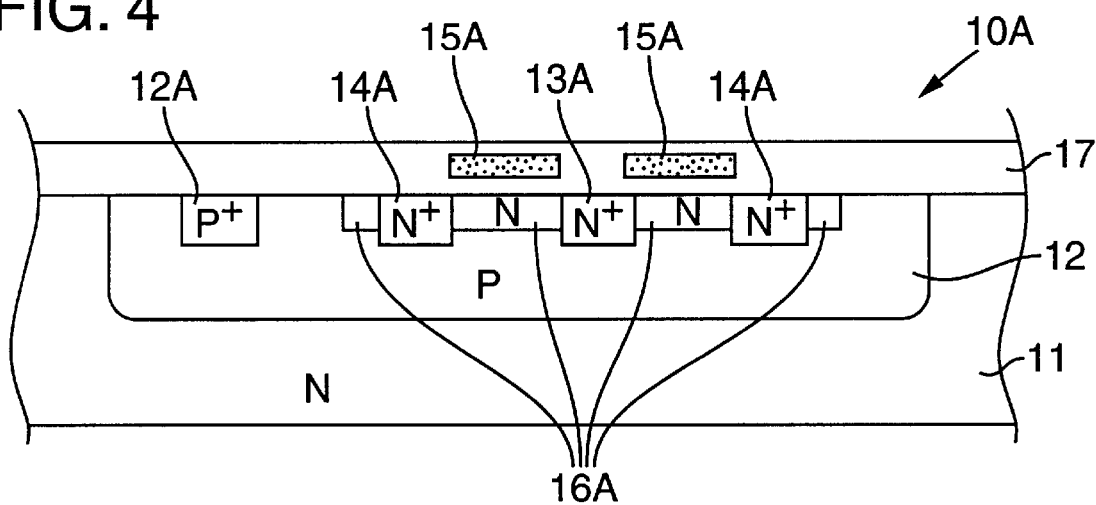
FIG. 4 is a sectional view of a second example embodiment of a MOS transistor according to the invention.

MOS transistors according to the invention can have other configurations. For example, FIG. 4 depicts a cross section of a second example embodiment. The MOS transistor 10A of FIG. 4 has certain features in common with the MOS transistor of FIG. 1. But, the MOS transistor 10A of the FIG. 4 embodiment is distinguished in that a small-sized N⁺-type high-concentration field 13A is situated near the surface of a well field 12. An N⁺-type high-concentration field 14A has a ring shape and surrounds the N⁺-type high-concentration field 13A. An N-type low-concentration field 16A is situated between the N⁺-type high-concentration field 13A and the N⁺-type high-concentration field 14A, and surrounds the N⁺-type high-concentration field 14A. A gate electrode 15A, formed to have a ring shape, is situated in the insulating film 17 at the top of the N-type low-concentration field 16A between the N⁺-type high-concentration field 13A and N⁺-type high-concentration field 14A.

For convenience in this discussion, the N⁺-type high-concentration field 13A is termed the "source field" and the N⁺-type high-concentration field 14A is termed the "drain field".

Figure 5:
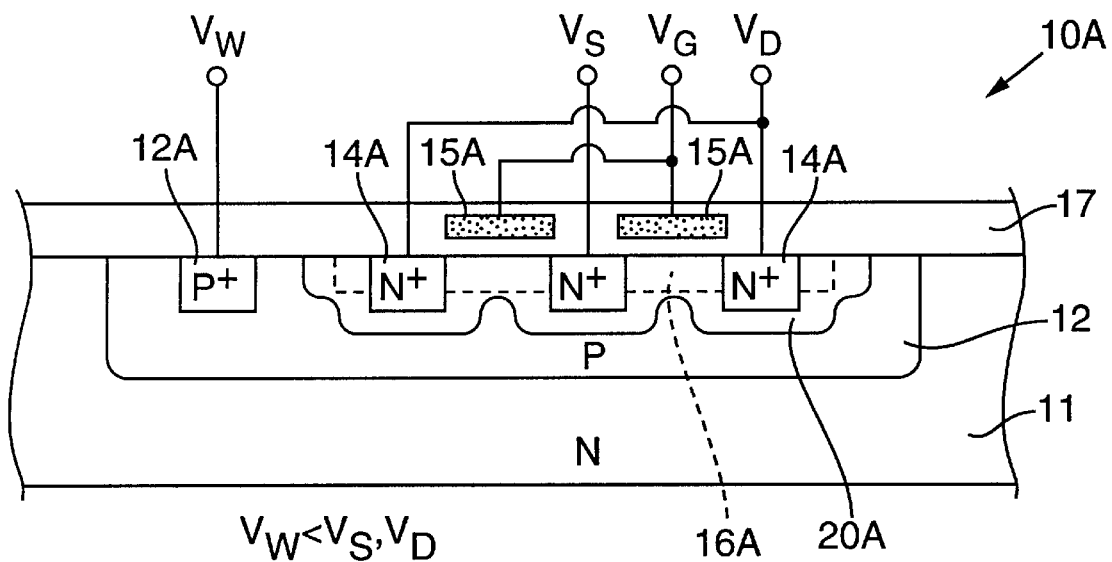
FIG. 5 is a sectional view of the FIG. 4 embodiment showing a condition in which the PN junction between the well field and source and drain fields is in a reverse-bias state.

FIG. 5 is a cross section of a situation with respect to the FIG. 4 embodiment in which the PN junction between the well field 12 and the source field 13A and the drain field 14A is in a reverse-bias state. The potentials $V_W$, $V_S$, $V_D$, and $V_G$ have the same relative values as shown in FIG. 2. By applying a reverse-bias voltage $V_R$ at the PN junction, the perimeters of the source field 13A and the drain field 14A and the entire N-type low-concentration field 16A are depleted, thereby forming a depletion layer 20A. Consequently, the PN junction capacitance $C_j$ can be reduced substantially relative to the prior art. In this example embodiment, the channel conductance $g_D$ of the MOS transistor 10B can have a high value for the same reason as in the example embodiment shown in FIG. 2.

Further with respect to the FIG. 4 embodiment, the size of the source field 13A is smaller than the size of the drain field 14A. This makes the PN junction capacitance in the source field 13A smaller than the PN-junction capacitance in the drain field 14A. In the SSIPD shown in FIG. 3, in contrast, the incidental capacitance $C_H$ arising in the output signal lines 6 presents a problem. Thus, whenever a MOS transistor 10A as in the FIG. 4 embodiment is used as the horizontal-relay MOS transistor 3 in FIG. 3, any incidental capacitance $C_H$ arising in the output signal lines 6 is substantially reduced by connecting the source field 13A to the output signal lines 6. In other words, the MOS transistor 10A of FIGS. 4 and 5 is especially suited for use in instances where the incidental capacitance is being reduced only in one or the other of the source or the drain.

Therefore, with a SSIPD, a MOS transistor, or an incidental-capacitance reduction method according to this invention, the low-concentration field of a secondary conductor is formed between and surrounding the primary and secondary high-concentration fields of a secondary conductor formed in the well field of a primary conductor. Whenever the junction of the primary conductor and secondary conductor between the well field and the primary and secondary high-concentration fields is in the reverse-bias state, any incidental capacitance can be reduced without reducing the channel conductance of the MOS transistor.

Whereas the invention has been described in connection with multiple example embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A solid-state image-pickup device, comprising:
   (a) a pixel operable to photoelectrically convert incident light to an electrical signal;
   (b) an output line for outputting the electrical signal produced by the pixel;
   (c) a MOS transistor comprising a gate, a first source/drain, and a second source/drain being connected to the pixel;
   (d) a scanning-signal source connected to the gate, the scanning-signal source being operable to produce a signal sufficient to cause the gate to either pass or not pass the electrical signal from the first source-drain to the second source-drain;
   (e) the MOS transistor comprising
      (i) a semiconductor substrate;
      (ii) a low-concentration well field of a primary conductor formed in the semiconductor substrate;
      (iii) a high-concentration contact field of the primary conductor contacting the well field;
      (iv) a primary high-concentration source field of a secondary conductor formed in the well field near the surface of the well field but separate from the contact field;
      (v) a secondary high-concentration drain field of the secondary conductor formed in the well field near the surface of the well field but separate from the contact field and the source field;

(vi) a low-concentration field of the secondary conductor formed between the source field and the drain field and surrounding the source and drain fields near the surface of the well field, the low-concentration field of the secondary conductor being arranged such that carriers present in the low-concentration field without applying any bias can be depleted by applying a reverse-bias voltage between the well field of the primary conductor and the source and drain fields of the secondary conductor; and (vii) a gate field formed above and separate from the low-concentration field of the secondary conductor so as to define a junction of the primary conductor with the secondary conductor between the source field and the drain field, the well field of the primary conductor and the source and drain fields of the secondary conductor being operable in a reverse-bias state in which the perimeters of the source and drain fields and the low-concentration field of the secondary conductor are depleted.

2. The solid-state image-pickup device of claim 1, wherein the substrate is N-type and the well field is P-type.

3. The solid-state image-pickup device of claim 2, wherein the high-concentration contact field of the primary conductor is $P^+$-type, and the source and drain fields are $N^+$-type.

4. The solid-state image-pickup device of claim 1, wherein the source field is connected to the output line and the drain field is connected to the pixel.

5. The solid-state image-pickup device of claim 1, comprising multiple pixels arranged into a pixel array.

6. A solid-state image-pickup device, comprising:

(a) photoelectric conversion means for photoelectrically converting and accumulating light from a photographic object into signal charges;

(b) output means for outputting a signal charge from said photoelectric conversion means;

(c) relay means for relaying signal charges from said photoelectric conversion means to said output means, said relay means being situated between said photoelectric conversion means and said output means;

(d) control means for controlling readout of signal charges by turning ON or OFF said relay means;

(e) said relay means comprising a MOS transistor comprising (i) a semiconductor substrate;

(ii) a low-concentration well field of a primary conductor formed in the semiconductor substrate;

(iii) a high-concentration contact field of the primary conductor contacting the well field;

(iv) a primary high-concentration source field of a secondary conductor formed in the well field near the surface of the well field but separate from the contact field;

(v) a secondary high-concentration drain field of the secondary conductor formed in the well field near the surface of the well field but separate from the contact field and the source field;

(vi) a low-concentration field of the secondary conductor formed between the source field and the drain field and surrounding the source and drain fields near the surface of the well fields, the low-concentration field of the secondary conductor being arranged such that carriers present in the low-concentration field without applying any bias can be depleted by applying a reverse-bias voltage between the well field of the primary conductor and the source and drain fields of the secondary conductor; and (vii) a gate field formed above and separate from the low-concentration field of the secondary conductor so as to define a junction of the primary conductor with the secondary conductor between the source field and the drain field, the well field of the primary conductor and the source and drain fields of the secondary conductor being operable in a reverse-bias state such that the perimeters of the source and drain fields and the low-concentration field of the secondary conductor are depleted.

7. A solid-state image-pickup device, comprising:

(a) a pixel operable to photoelectrically convert incident light to a signal charge;

(b) an output line for outputting signal charges produced by the pixel;

(c) an electrical relay connected between the pixel and the output line so as to relay the signal charges from the pixel to the output line;

(d) a controller connected to the electrical relay, the controller being operable to send a signal to the electrical relay urging the electrical relay to turn ON to conduct the signal charges from the pixel to the output line; and (e) the electrical relay comprising a MOS transistor, comprising (i) a semiconductor substrate;

(ii) a low-concentration well field of a primary conductor formed in the semiconductor substrate;

(iii) a high-concentration contact field of the primary conductor contacting the well field;

(iv) a primary high-concentration source field of a secondary conductor formed in the well field near the surface of the well field but separate from the contact field;

(v) a secondary high-concentration drain field of the secondary conductor separate from the contact field and surrounding the source field in the well field near the surface of the well field;

(vi) a low-concentration field of the secondary conductor formed between the source field and the drain field and surrounding the source and drain fields near the surface of the well field, the low-concentration field of the secondary conductor being arranged such that carriers present in the low-concentration field without applying any bias can be depleted by applying a reverse-bias voltage between the well field of the primary conductor and the source and drain fields of the secondary conductor; and (vii) a gate field formed in a ring shape above and separate from the low-concentration field of the secondary conductor so as to define a junction of the primary conductor with the secondary conductor between the source field and the drain field, the well field of the primary conductor and the source and drain fields of the secondary conductor being operable in a reverse-bias state such that the perimeters of the source and drain fields and the low-concentration field of the secondary conductor are depleted.

8. The solid-state image-pickup device of claim 7, wherein the primary high-concentration field of the secondary conductor is connected to the output line and the secondary high-concentration field of the secondary conductor is connected to the pixel.

9. A MOS transistor, comprising:

(a) a low-concentration well field of a primary conductor formed in a semiconductor substrate;

(b) a high-concentration contact field of the primary conductor contacting the well field;

(c) a primary high-concentration source field of a secondary conductor formed in the well field near the surface of the well field but separate from the contact field;

(d) a secondary high-concentration drain field of the secondary conductor formed in the well field near the surface of the well field but separate from the contact field and the source field;

(e) a low-concentration field of the secondary conductor formed between the source field and the drain field and surrounding the source and drain fields near the surface of the well field, the low-concentration field of the secondary conductor being arranged such that carriers present in the low-concentration field without applying any bias can be depleted by applying a reverse-bias voltage between the well field of the primary conductor and the source and drain fields of the secondary conductor; and (f) a gate field formed above and separate from the low-concentration field of the secondary conductor so as to define a junction of the primary conductor with the secondary conductor between the source field and the drain field, the well field of the primary conductor and the source and drain fields of the secondary conductor being operable in a reverse-bias state such that the perimeters of the source and drain fields and the low-concentration field of the secondary conductor are depleted.

10. The MOS transistor of claim 9, wherein the substrate is N-type and the well field is P-type.

11. The MOS transistor of claim 10, wherein the high-concentration contact field of the primary conductor is $P^+$-type, and the source and drain fields are $N^+$-type.

12. A switching device exhibiting a reduced incidental capacitance, comprising:

(a) a MOS transistor comprising a semiconductor substrate, a low-concentration well field of a primary conductor formed in the substrate, a high-concentration contact field of the primary conductor contacting the well field, a primary high-concentration source field of a secondary conductor formed in the well field near the surface of the well field but separate from the contact field, a secondary high-concentration drain field of the secondary conductor formed in the well field near the surface of the well field but separate from the contact field and the source field, a low-concentration field of the secondary conductor formed between the source field and the drain field and surrounding the source and drain fields near the surface of the well field, and a gate field formed above and separate from the low-concentration field of the secondary conductor so as to define a junction of the primary conductor with the secondary conductor between the source field and the drain field; and (b) the perimeters of the source and drain fields and the low-concentration field of the secondary conductor undergoing depletion upon connecting the well field of the MOS transistor to apply a reverse-bias voltage between the well field of the primary conductor and the source and drain fields of the secondary conductor.

* * * * *

UNITED STATES PATENT AND TRADEMARK OFFICE
CERTIFICATE OF CORRECTION

PATENT NO. : 6,111,281                                        Page 1 of 1
DATED     : August 29, 2000
INVENTOR(S) : Tadao Isogai It is certified that error appears in the above-identified patent and that said Letters Patent is hereby corrected as shown below:

ABSTRACT,
Line 6, change "that in" to -- that is in --.

Column 10,
Lines 49-50, change "and a second source/drain being connected to the pixel;" to
-- and a second source/drain, the first source/drain being connected to the output line and the second source/drain being connected to the pixel; --
Line 54, change "source-drain" to -- source/drain --
Line 55, change "source-drain" to -- source/drain --

Signed and Sealed this

Eighteenth Day of December, 2001

Attest:

JAMES E. ROGAN
Attesting Officer      Director of the United States Patent and Trademark Office